US011187743B2

(12) United States Patent
Hantsch et al.

(10) Patent No.: US 11,187,743 B2
(45) Date of Patent: Nov. 30, 2021

(54) AUTOMATED TEST EQUIPMENT FOR COMBINED SIGNALS

(71) Applicant: Advantest Corporation, Tokyo (JP)

(72) Inventors: Andreas Hantsch, Heidelberg (DE); Jochen Rivoir, Magstadt (DE)

(73) Assignee: ADVANTEST CORPORATION, Tokyo (JP)

( * ) Notice: Subject to any disclaimer, the term of this patent is extended or adjusted under 35 U.S.C. 154(b) by 336 days.

(21) Appl. No.: 15/821,945

(22) Filed: Nov. 24, 2017

(65) Prior Publication Data

US 2018/0088172 A1    Mar. 29, 2018

Related U.S. Application Data

(63) Continuation of application No. PCT/EP2015/061764, filed on May 27, 2015.

(51) Int. Cl.
*G01R 31/28* (2006.01)
*G01R 31/319* (2006.01)
*G01R 31/3167* (2006.01)

(52) U.S. Cl.
CPC ... *G01R 31/2834* (2013.01); *G01R 31/31908* (2013.01); *G01R 31/31926* (2013.01); *G01R 31/3167* (2013.01)

(58) Field of Classification Search
CPC ............ G01R 31/2834; G01R 31/3167; G01R 31/31908; G01R 31/31926; G01R 31/2812
USPC ...... 257/E21.521; 324/500, 522, 537, 50.01; 702/58, 59, 108, 117, 118, 124, 183, 188
See application file for complete search history.

(56) References Cited

U.S. PATENT DOCUMENTS

| | | | |
|---|---|---|---|
| 5,615,380 A | * | 3/1997 | Hyatt .................. B60R 16/0373 345/520 |
| 5,629,880 A | * | 5/1997 | Negishi ............ G01R 31/31713 702/117 |
| 6,292,415 B1 | | 9/2001 | Brehm |
| 6,327,545 B1 | | 12/2001 | Browen et al. |
| 6,397,160 B1 | | 5/2002 | Craig et al. |
| 6,452,411 B1 | | 9/2002 | Miller et al. |
| 6,480,978 B1 | | 11/2002 | Roy et al. |
| 6,693,566 B2 | | 2/2004 | Jaffe et al. |
| 6,795,496 B1 | | 9/2004 | Soma et al. |

(Continued)

FOREIGN PATENT DOCUMENTS

| | | |
|---|---|---|
| EP | 0626588 | 11/1994 |
| EP | 0984291 | 3/2000 |

(Continued)

OTHER PUBLICATIONS

Quintanel, S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.

(Continued)

*Primary Examiner* — John E Breene
*Assistant Examiner* — Jeffrey P Aiello

(57) ABSTRACT

An automated test equipment for testing devices under test is configured to combine different output signals from multiple pins of a single device under test or from pins of a plurality of devices under test to obtain a combined signal; and to extract individual signals or properties of the individual signals from the combined signal.

19 Claims, 10 Drawing Sheets

(56) References Cited

U.S. PATENT DOCUMENTS

| | | | |
|---|---|---|---|
| 6,828,926 | B2 | 12/2004 | Jaffe et al. |
| 6,885,700 | B1* | 4/2005 | Kim ............... G01R 31/3016 |
| | | | 375/224 |
| 6,891,485 | B2 | 5/2005 | Jaffe et al. |
| 6,897,791 | B2 | 5/2005 | Jaffe et al. |
| 6,985,093 | B2 | 1/2006 | Jaffe et al. |
| 7,256,585 | B1 | 8/2007 | Shoulders |
| 7,420,481 | B2 | 9/2008 | Jaffe et al. |
| 8,706,062 | B1* | 4/2014 | Yu ..................... H03F 1/3223 |
| | | | 455/126 |
| 2003/0058148 | A1* | 3/2003 | Sheen ............. H03M 1/0626 |
| | | | 341/155 |
| 2003/0222652 | A1* | 12/2003 | Martens ............. G01R 23/20 |
| | | | 324/520 |
| 2004/0004466 | A1 | 1/2004 | Miyanaga et al. |
| 2005/0050546 | A1 | 3/2005 | Remany et al. |
| 2005/0068068 | A1 | 3/2005 | Hall |
| 2005/0104597 | A1* | 5/2005 | Klijn ............... G01R 31/3278 |
| | | | 324/418 |
| 2005/0172181 | A1* | 8/2005 | Huliehel ......... G01R 31/2834 |
| | | | 714/724 |
| 2005/0234662 | A1 | 10/2005 | Niedzwiecki et al. |
| 2009/0092177 | A1 | 4/2009 | Dvorak et al. |
| 2009/0129129 | A1 | 5/2009 | Udagawa |
| 2009/0240365 | A1 | 9/2009 | Nijima et al. |
| 2009/0272634 | A1 | 11/2009 | Ehlers et al. |
| 2010/0176815 | A1* | 7/2010 | Roth ............... G01R 31/31905 |
| | | | 324/533 |
| 2010/0225301 | A1 | 9/2010 | Nakayama et al. |
| 2010/0228515 | A1 | 9/2010 | Srinivasan et al. |
| 2010/0309952 | A1 | 12/2010 | Asami |
| 2010/0312506 | A1 | 12/2010 | Taylor |
| 2011/0131000 | A1 | 6/2011 | Daub et al. |
| 2011/0227767 | A1* | 9/2011 | O'Brien ............. G01D 5/24452 |
| | | | 341/118 |
| 2012/0049655 | A1 | 3/2012 | Leyendecker et al. |
| 2012/0161784 | A1* | 6/2012 | Benedikt ........... G01R 31/2822 |
| | | | 324/612 |
| 2012/0221279 | A1 | 8/2012 | Zhang |
| 2013/0006567 | A1 | 1/2013 | Horn |
| 2013/0229068 | A1 | 9/2013 | Sanders, III et al. |
| 2013/0234723 | A1 | 9/2013 | Behrens et al. |
| 2014/0049267 | A1* | 2/2014 | Cordaro ............. G01R 23/20 |
| | | | 324/624 |
| 2014/0195870 | A1* | 7/2014 | Ma ..................... G11C 29/56 |
| | | | 714/735 |

FOREIGN PATENT DOCUMENTS

| | | |
|---|---|---|
| EP | 1298778 | 4/2003 |
| JP | H11038087 | 2/1999 |
| JP | 2000009792 | 1/2000 |
| WO | 99/21025 | 4/1999 |
| WO | 2012/084028 | 6/2012 |
| WO | 2014/135194 | 9/2014 |

OTHER PUBLICATIONS

Lenk, F., et al., "A New Multiport Measurement-Method Using a Two-Port Network Analyzer," IEEE MTT-S International Microwave Symposium, Jun. 12-17, 2005, pp. 1663-1666.

Kam, D.G., et al., "Multiport Measurement Method Using a Two-Port Network Analyzer With Remaining Ports Unterminated," IEEE Microwave and Wireless Components Letters, vol. 17, No. 9, Sep. 2007, pp. 694-696.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multiport Method for the Measurement of the Scattering Parameters of N-Ports," IEEE Transactions on Microwave Theory and Techniques, vol. 53, No. 6, Jun. 2005, pp. 1990-1996.

Sismanoglou, P., et al., "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.

* cited by examiner

AUTOMATED TEST EQUIPMENT FOR COMBINED SIGNALS

CROSS-REFERENCE TO RELATED APPLICATIONS

This application is a continuation of copending International Application No. PCT/EP2015/061764, filed May 27, 2015, which is incorporated herein by reference in its entirety.

Embodiments of the present invention relate to an automated test equipment for testing devices under test. Further embodiments relate to an automated test equipment for testing devices under test. Further embodiments relate to a method for testing devices under test. Still further embodiments relate to a computer program for implementing said method.

BACKGROUND OF THE INVENTION

Electronic devices usually comprise electronic circuitry carrying a large number of electronic components such as semiconductors, diodes or the like. In order to proof the layout and the desired behavior of the electronic device, i.e. to check whether a certain input generates a desired output, electronic devices are tested. However, due to the high complexity of modern electronic devices, testing is costly in terms of time and money. Thus, electronic devices may be tested automatically by means of an automated test equipment.

The devices that are to be tested, which devices are also referred to as Devices Under Test or DUT, may be tested individually, whereas each device under test can be connected to multiple pins in order to process multiple signals. These scenarios are referred to as multi-pin tests. In order to further expedite the testing process, a plurality of devices under test may be provided. Such a scenario is referred to as multi-site test.

Multi-site or multi-pin tests may use one automated test equipment resource per signal pin that is to be measured. If the number of available resources is smaller than the number of signals to be measured, the measurements have to be conducted sequentially by switching the available resources to the respective signals.

FIG. 1A shows such a conventional test site 100, wherein one automated test equipment resource 101, 102, 103 is used for measuring each one of the signals 104, 105, 106. Even though this kind of automated testing may be expensive due to the raised amount of automated test equipment resources 101, 102, 103 that may be used, it provides for a fast testing because all measurements 107, 108, 109 can be conducted in parallel, as shown in FIG. 1B.

FIG. 2A shows a further conventional test site 200, wherein one single automated test equipment resource 204 is used for measuring a plurality of signals 201, 202, 203. A switch 205 is used to select a respective one of the plurality of signals 201, 202, 203 at a time. Accordingly, all signals 201, 202, 203 are measured sequentially by switching from one signal to the next. Even though this kind of automated testing may only provide for a slow testing because all measurements 206, 207, 208 are conducted sequentially, as shown in FIG. 2B, it is cheap since only one automated test equipment resource 204 may be used.

SUMMARY

An embodiment may have an automated test equipment for testing devices under test, configured to generate a combined signal including a plurality of different signal components, and to provide the combined signal to multiple pins of a single device under test or to pins of a plurality of devices under test.

Another embodiment may have an automated test equipment for testing devices under test, configured to combine different output signals from multiple pins of a single device under test or from pins of a plurality of devices under test to acquire a combined signal; and to extract individual signals or properties of the individual signals from the combined signal.

According to another embodiment, a method for testing devices under test may have the steps of: combining different output signals from multiple pins of a single device under test or from pins of a plurality of devices under test to acquire a combined signal; and extracting individual signals or properties of the individual signals from the combined signal.

Another embodiment may have a non-transitory digital storage medium having a computer program stored thereon to perform the method for testing devices under test, wherein the method may have the steps of: combining different output signals from multiple pins of a single device under test or from pins of a plurality of devices under test to acquire a combined signal; and extracting individual signals or properties of the individual signals from the combined signal, when said computer program is run by a computer.

According to a first aspect, an automated test equipment for testing devices under test is provided, wherein the automated test equipment is configured to generate a combined signal comprising a plurality of different signal components. The inventive automated test equipment is further configured to provide the combined signal to multiple pins of a single device under test or to pins of a plurality of devices under test. Thus, it is possible to provide a combined signal comprising several different signal components to a plurality of pins of a device under test, or to a plurality of devices under test, at the same time. The combined signal may comprise signal components having distinctly different signal characteristics. The automated test equipment may, for instance, be configured to combine an analog signal and a digital signal, or a time-continuous signal and a time-varying signal into a combined signal. Since the combined signal may be present at each pin of the available devices under test, all of the signal components contained in the combined signal may be fed simultaneously into the available devices under test and, thus, all of the available devices under test may be tested simultaneously. The automated test equipment may be configured to control the devices under test such that, at a given time, only selected ones of the signal components contained in the combined signal may be fed into the devices under test.

According to a second aspect, an automated test equipment for testing devices under test is provided, wherein the automated test equipment is configured to combine different output signals from multiple pins of a single device under test or from pins of a plurality of devices under test to obtain a combined signal. The automated test equipment is further configured to extract individual signals or properties of the individual signals from the combined signal. Thus, it is possible to combine different individual output signals into one common combined signal that may be fed into one single automated test equipment tester resource. The tester resource may measure the combined signal and provide a result for each of the individual signals contained in the combined signal. Stated differently, the tester resource may measure all of the individual output signals contained in the combined signal at the same time. For that, the automated tester equipment is configured to extract the individual output signals from the combined signal. The individual output signals may have distinctly different signal characteristics. For example, the automated test equipment may combine a digital signal and an analog signal, or a time-constant signal and a time-varying signal into a single common combined signal. Furthermore, the automated tester equipment is also able to separate these different individual signals from each other during extraction of the individual signals from the combined signal. Accordingly, it is possible to measure a plurality of different individual output signals in one single shot, i.e. at substantially the same time, while using only one single automated test equipment tester resource since all of the available individual output signals may be combined into one single common combined signal that is fed into the tester resource. Thus, the automated test equipment according to the present invention provides for a cheap and a fast automated testing.

According to a third aspect, a method for testing devices under test is provided, wherein the method comprises combining different output signals from multiple pins of a single device under test or from pins of a plurality of devices under test to obtain a combined signal. The method further comprises extracting individual signals or properties of the individual signals from the combined signal.

According to a fourth aspect, computer programs are provided, wherein each of the computer programs is configured to implement the above-described method when being executed on a computer or signal processor, so that the above-described method is implemented by one of the computer programs.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
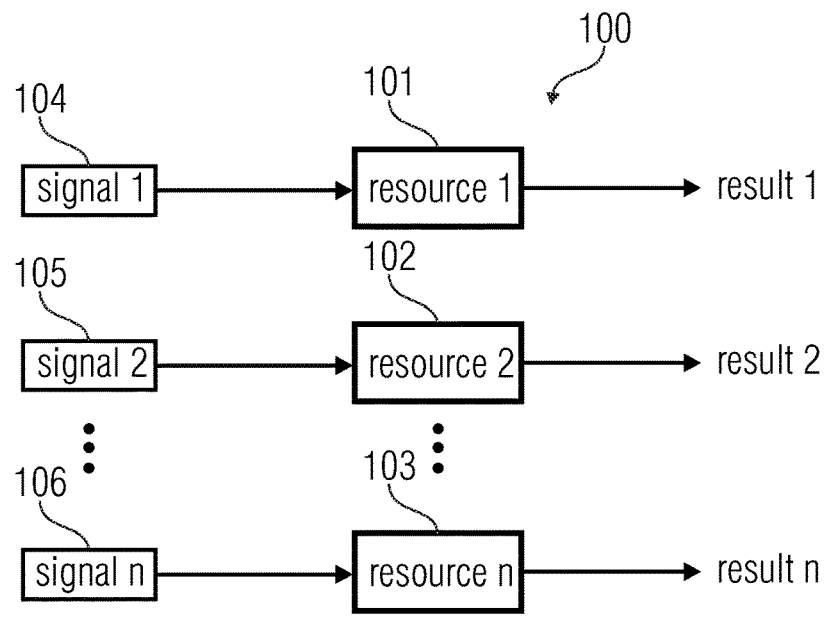
FIG. 1A shows a block diagram of a conventional testing site according to conventional technology.
Figure 1B:
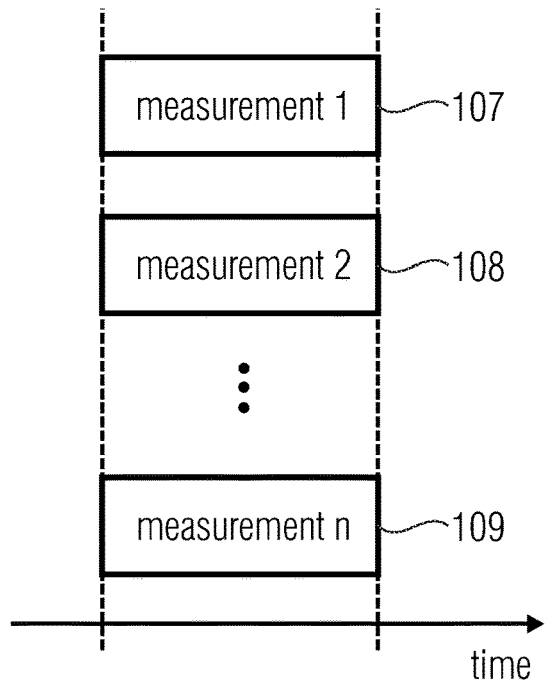
FIG. 1B shows a timing diagram of a conventional parallel testing procedure according to conventional technology.
Figure 2A:
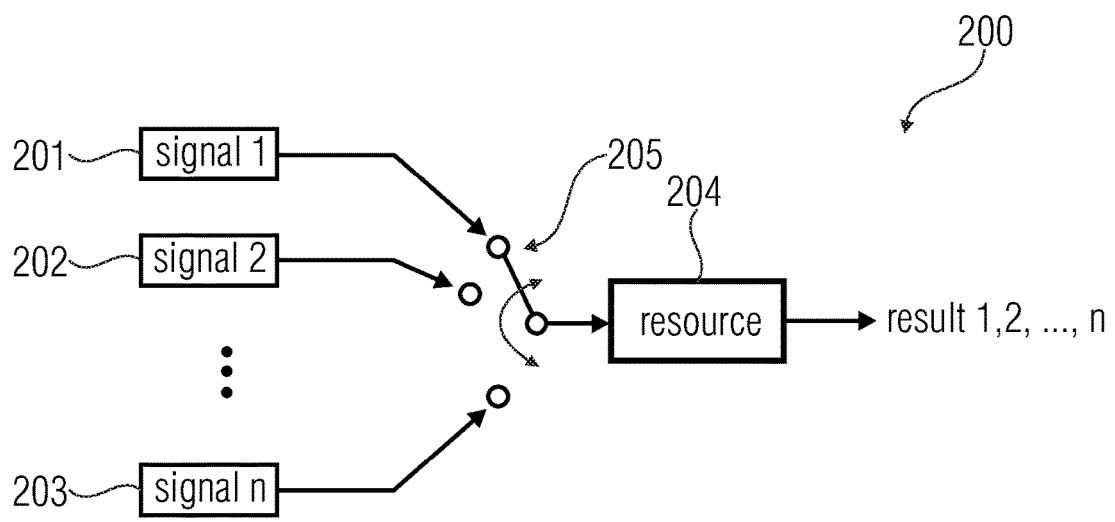
FIG. 2A shows a block diagram of a further conventional testing site according to conventional technology.
Figure 2B:
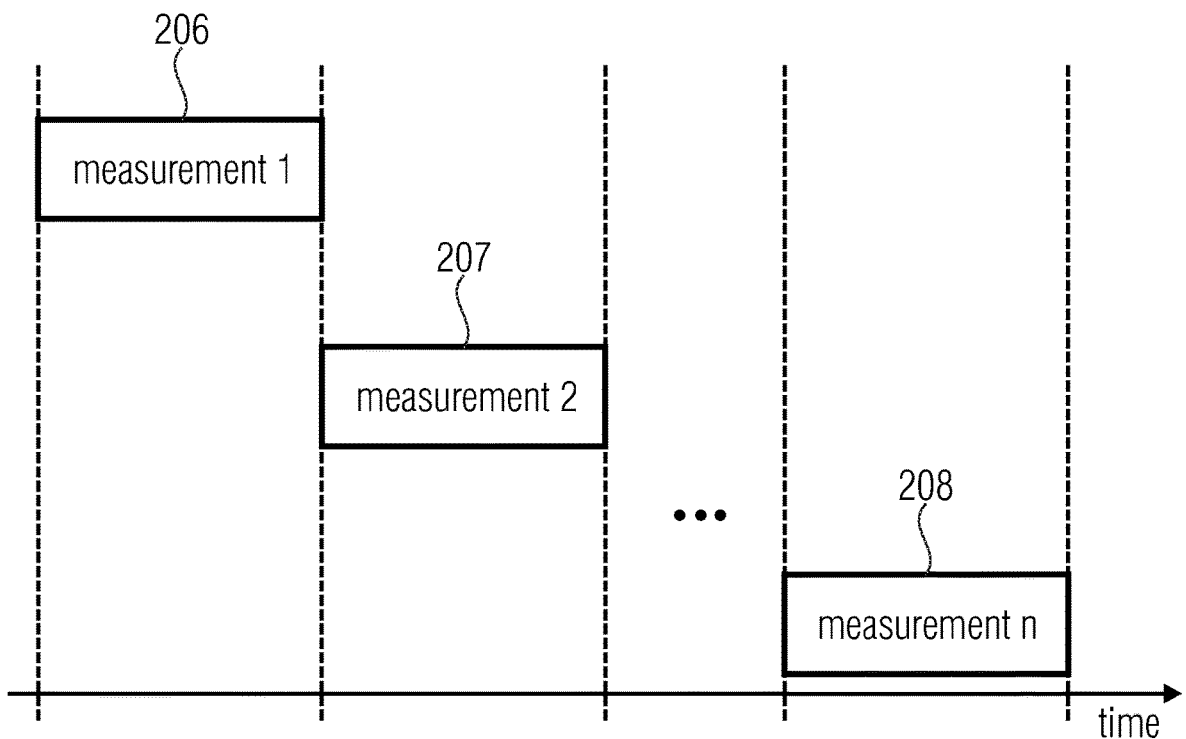
FIG. 2B shows a timing diagram of a conventional sequential testing procedure according to conventional technology.

Equal or equivalent elements or elements with equal or equivalent functionality are denoted in the following description by equal or equivalent reference numerals.

While FIGS. 1A, 1B, 2A and 2B have been described above with respect to conventional technology, a first embodiment of the invention will be described with reference to FIG. 3.

Figure 3:
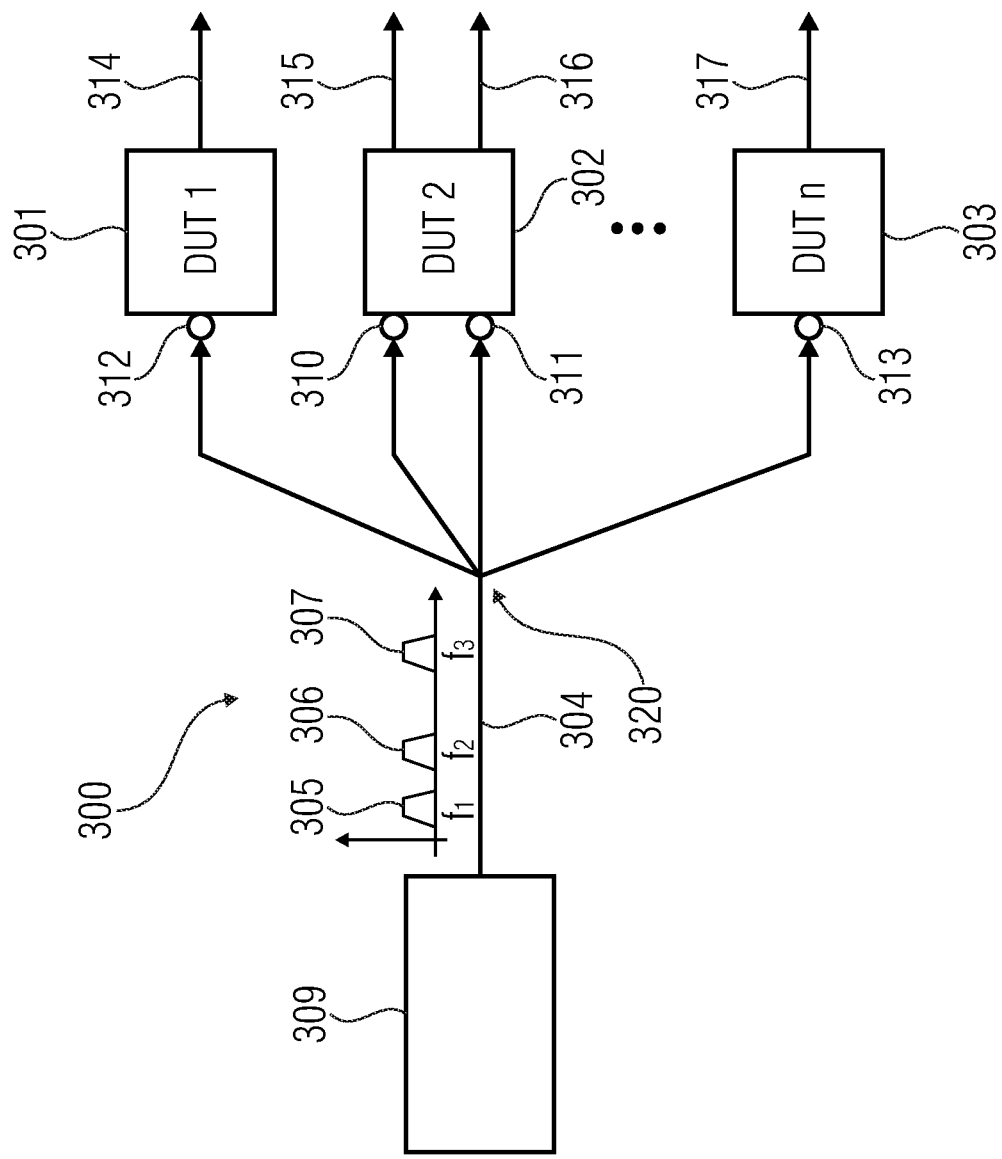
FIG. 3 shows a block diagram of an automated test equipment according to an embodiment of the present invention.

FIG. 3 shows an automated test equipment 300 for testing devices under test 301, 302, 303. The automated test equipment 300 is configured to generate a combined signal 304. The combined signal 304 comprises a plurality of different signal components 305, 306, 307. The different signal components may be, for instance, a first signal component 305, e.g. at a first frequency or frequency band $f_1$, a second signal component 306, e.g. at a second frequency or frequency band $f_2$, and a third signal component 307, e.g. at a third frequency or frequency band $f_3$.

The automated test equipment 300 may further comprise an automated test equipment output resource 309 for generating the combined signal 304.

The devices under test 301, 302, 303 may comprise one or more input pins. For example, the first device under test 301 may comprise one pin 312, the second device under test 302 may comprise two pins 310, 311 and a $n^{th}$ device under test 303 may comprise one pin 313. However, a device under test may comprise more than one or more than two pins.

The automated test equipment 300 is configured to provide the combined signal 304 to multiple pins 310, 311 of a single device under test 302. Additionally or alternatively, the automated test equipment 300 is configured to provide the combined signal 304 to pins 310, 311, 312, 313 of a plurality of devices under test 301, 302, 303.

The automated test equipment 300 may comprise a node 320 which is adapted to distribute the combined signal 304 to one or more of the pins 310, 311, 312, 313 of the devices under test 301, 302, 303. In the example shown in FIG. 3, the combined signal 304 is distributed to each of the pins 310, 311, 312, 313. The combined signal 304 may be distributed to the pins 310, 311, 312, 313 at substantially the same time, i.e. each of the pins 310, 311, 312, 313 may receive the combined signal 304 at substantially the same time. However, it may also be possible that the node 320 distributes the combined signal 304 to the pins 310, 311, 312, 313 of the respective device under test 301, 302, 303 serially, i.e. at different or subsequent points of time.

Each of the devices under test 301, 302, 303 may generate one or more output signals 314, 315, 316, 317. For example, the first device under test 301 may generate an output signal 314, the second device under test 302 may generate two output signals 315, 316, and a $n^{th}$ device under test 303 may generate an output signal 317. The generated output signals 314, 315, 316, 317 may depend on the respective input signals or input signal components 305, 306, 307, respectively.

The signal components that may be contained in the combined signal 304 may have different signal characteristics. The embodiment depicted in FIG. 3 may show three different signal components 305, 306, 307, wherein each of the signals may comprise a different signal characteristic, e.g. different frequencies $f_1$, $f_2$ and $f_3$.

Furthermore, different signal types may be combined into the combined signal 304, for example a digital signal and an analog signal, and/or a time-constant signal and a time-varying signal.

The automated test equipment 300 may be configured to combine such different signal components into a single common combined signal 304 and to provide this combined signal 304 to the input pins 310, 311, 312, 313 of the available devices under test 301, 302, 303.

Figure 4:
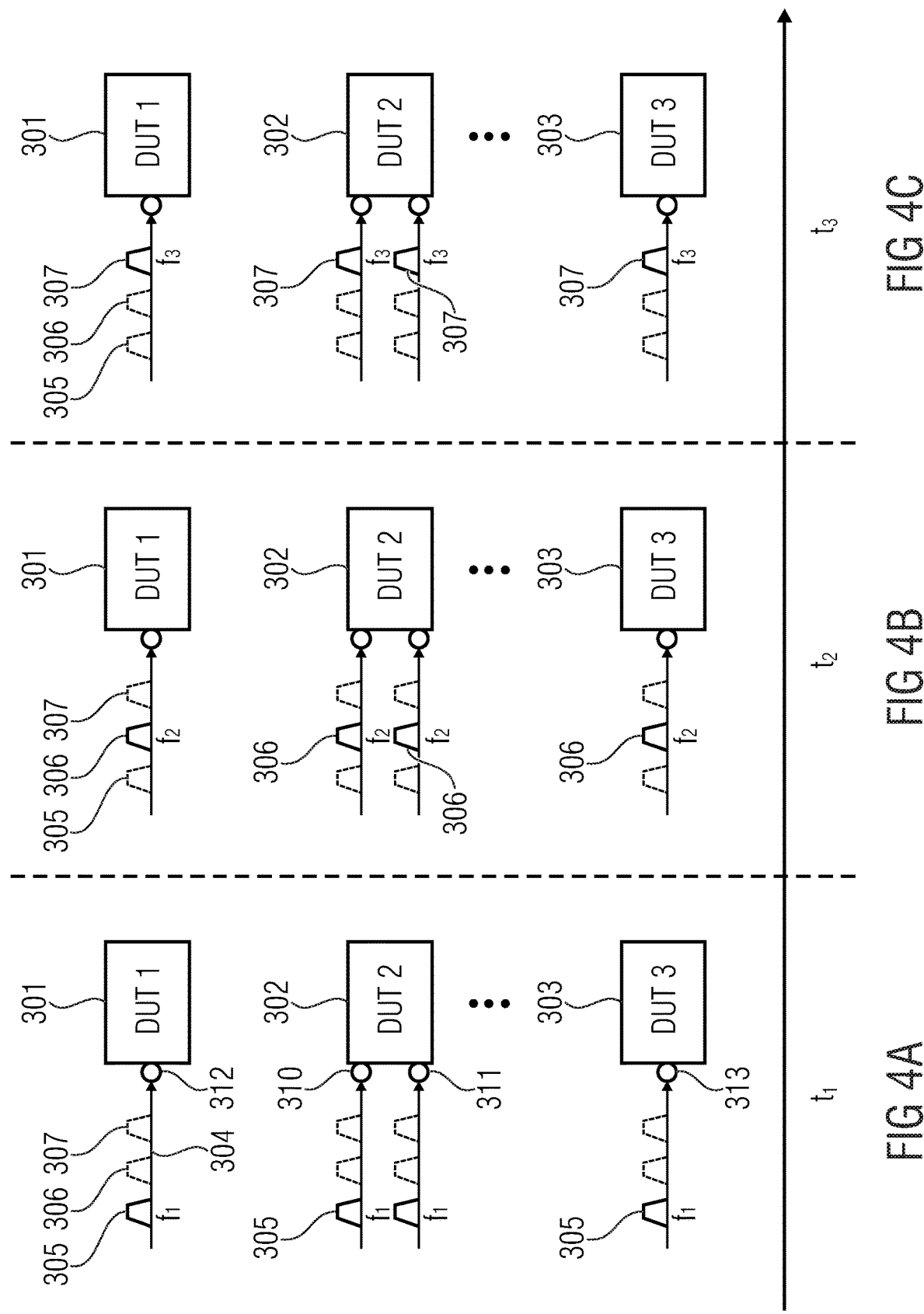
FIGS. 4A-4C show a timing diagram of an automated test equipment at different points in time $t_1$ to $t_3$.

With reference to FIGS. 4A, 4B and 4C, the automated test equipment 300 is configured to control the devices under test 301, 302, 303 such that, at a given time $t_1$, $t_2$, $t_3$, different devices under test 301, 302, 303 evaluate the same signal component 305, 306, 307 of the combined signal 304. In an embodiment, the automated test equipment 300 may be configured to control the devices under test 301, 302, 303 such that, at a given time $t_1$, $t_2$, $t_3$, each or all of the available devices under test 301, 302, 303 evaluate the same signal component 305, 306, 307 of the combined signal 304.

As described above with reference to FIG. 3, the combined signal 304 may comprise a plurality of different signal components 305, 306, 307 which may have a different signal characteristic or which may be of a different type of signal.

FIG. 4A shows three devices under test 301, 302, 303 at a given time $t_1$, wherein the three devices under test 301, 302, 303 are fed with the combined signal 304. At the time $t_1$, the automated test equipment 300 controls the three devices under test 301, 302, 303 such that each of the three devices under test 301, 302, 303 evaluates the same signal component 305 of the combined signal 304. In other words, at the time $t_1$, each of the available devices under test 301, 302, 303 receives the same signal component 305 contained in the combined signal 304.

Stated differently, at the time $t_1$ the devices under test 301, 302, 303 are controlled such that only the first signal component 305 is selected and evaluated by the respective device under test 301, 302, 303, even though the combined signal 304 which comprises all of the signal components 305, 306, 307 is received at the respective pins 310, 311, 312, 313 of the devices under test 301, 302, 303. Thus, the remaining signal components 306, 307 that are not evaluated at the time $t_1$, but which may also be present in the combined signal 304, are depicted in FIG. 4A in dashed lines.

Stated yet differently, even though the combined signal 304 may comprise a plurality of different signal components 305, 306, 307, and even though all signal components may be received at the pins 310, 311, 312, 313, the devices under test 301, 302, 303 are controlled such that only one of the signal components, namely the first signal component 305, is selectively fed into the respective device under test 301, 302, 303 at the time $t_1$. Accordingly, at the time $t_1$, each one of the devices under test 301, 302, 303 evaluates the same signal component, namely the first signal component 305.

FIG. 4B shows the same three devices under test 301, 302, 303 at a subsequent point of time, i.e. at the time $t_2$ following $t_1$. In this case, the devices under test 301, 302, 303 are controlled such that only the second signal component, i.e. signal component 306 is selectively received at the pins 310, 311, 312, 313 and fed into the respective device under test 301, 302, 303. Accordingly, at the time $t_2$, each one of the devices under test 301, 302, 303 evaluates the same signal component, namely the second signal component 306, whereas the first and third signal components 305, 307 are not evaluated at $t_2$ and are, thus, depicted in dashed lines.

FIG. 4C shows the same three devices under test 301, 302, 303 at a subsequent point of time, i.e. at the time $t_3$ following $t_2$. In this case, the devices under test 301, 302, 303 are controlled such that only the third signal component, i.e. signal component 307, is selectively received at the pins 310, 311, 312, 313 and fed into the respective device under test 301, 302, 303. Accordingly, at the time $t_3$, each one of the devices under test 301, 302, 303 evaluates the same signal component, namely the third signal component 307, whereas the first and second signal components 305, 306 are not evaluated at $t_3$ and are, thus, depicted in dashed lines.

Figure 5:
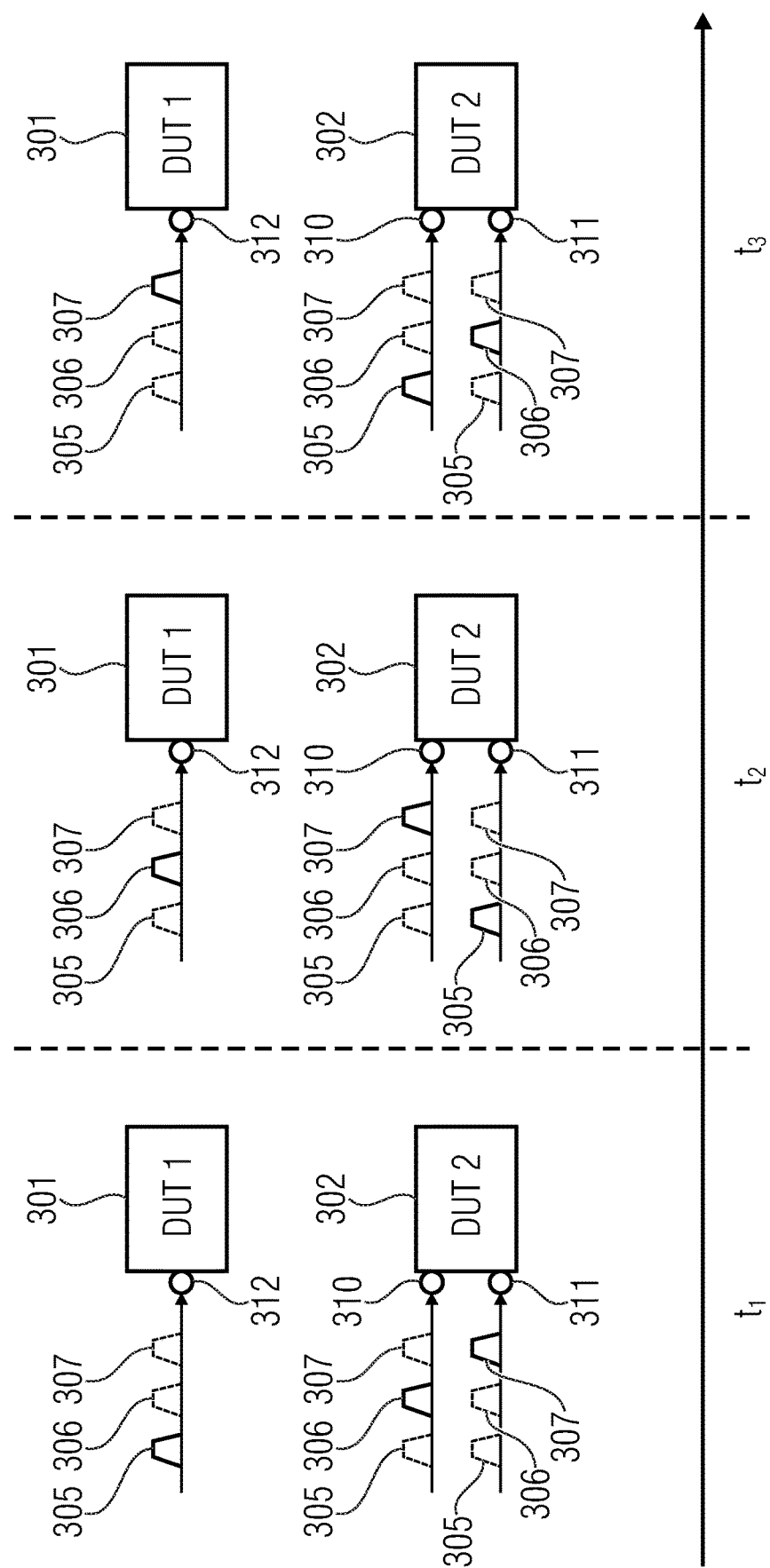
FIGS. 5A-5C show a further timing diagram of an automated test equipment at different points in time $t_1$ to $t_3$.

FIGS. 5A, 5B and 5C show two devices under test 301, 302. The first device under test 301 comprises one input pin 312. The second device under test 302 comprises a first input pin 310 and a second input pin 311. The automated test equipment 300 is configured to control the devices under test 301, 302 such that, at a given time $t_1$, $t_2$, $t_3$, different devices under test 301, 302 evaluate different signal components 305, 306, 307 of the combined signal 304. In an embodiment, the automated test equipment 300 may be configured to control the devices under test 301, 302 such that, at a given time $t_1$, $t_2$, $t_3$, one or more or each one of the available devices under test 301, 302 may evaluate a different signal component 305, 306, 307 contained in the combined signal 304.

As described above with reference to FIG. 3, the combined signal 304 may comprise a plurality of different signal components 305, 306, 307. FIG. 5A shows the two devices under test 301, 302 at a given time $t_1$, wherein both devices under test 301, 302 are fed with the combined signal 304 at the time $t_1$.

At the time $t_1$, the automated test equipment 300 controls the two devices under test 301, 302 such that each one of the two devices under test 301, 302 evaluates a different signal component 305, 306, 307 of the combined signal 304.

In particular, at the time $t_1$ the first device under test 301 is controlled such that only the first signal component 305 is received at the respective pin 312 and evaluated by the first device under test 301, while the second device under test 302 is controlled such that only the second signal component 306 is received at the pin 310 and evaluated by the second device under test 302, and only the third signal component 307 is received at the pin 311 and evaluated by the second device under test 302. The remaining signal components 305, 306, 307 that are received at the respective pins 310, 311, 312 but which are not evaluated at the time $t_1$ (but which may also be present in the combined signal 304) are depicted in FIG. 5A in dashed lines.

FIG. 5B shows the same two devices under test 301, 302 at a subsequent point of time, i.e. at the time $t_2$ following $t_1$. The devices under test 301, 302 are controlled such that each one of the two devices under test 301, 302 evaluates a different signal component 305, 306, 307 of the combined signal 304.

In particular, at the time $t_2$ the first device under test 301 is controlled such that only the second signal component 306 is received at the respective pin 312 and evaluated by the first device under test 301. The second device under test 302 is controlled such that only the third signal component 307 is received at the pin 310 and evaluated by the second device under test 302, and only the first signal component 305 is received at the pin 311 and evaluated by the second device under test 302. The remaining signal components 305, 306, 307 that are received at the respective pins 310, 311, 312 but which are not evaluated at the time $t_2$ (but which may also be present in the combined signal 304) are depicted in FIG. 5B in dashed lines.

FIG. 5C shows the same two devices under test 301, 302 at a subsequent point of time, i.e. at the time $t_3$ following $t_2$. The devices under test 301, 302 are controlled such that each one of the two devices under test 301, 302 evaluates a different signal component 305, 306, 307 of the combined signal 304.

In particular, at the time $t_3$ the first device under test 301 is controlled such that only the third signal component 307 is received at the respective pin 312 and evaluated by the first device under test 301. The second device under test 302 is controlled such that only the first signal component 305 is received at the pin 310 and evaluated by the second device under test 302, and only the second signal component 306 is received at the pin 311 and evaluated by the second device under test 302. The remaining signal components 305, 306, 307 that are received at the respective pins 310, 311, 312 but which are not evaluated at the time $t_3$ (but which may also be present in the combined signal 304) are depicted in FIG. 5C in dashed lines.

In other words, the first device under test 301 may, for instance, receive and evaluate the first signal component 305 at $t_1$, then the second signal component 306 at $t_2$, and then the third signal component 307 at $t_3$. The second device under test 302 may, for instance, receive and evaluate the second signal component 306 at $t_1$, then the third signal component 307 at $t_2$, and then the first signal component 305 at $t_3$. Accordingly, the order in which the signal components 305, 306, 307 are selectively received and evaluated by the respective devices under test 301, 302 may rotate.

It may be possible that the order in which the signal components 305, 306, 307 are selectively received and evaluated by the devices under test 301, 302 may deviate from the selection described with reference to FIGS. 5A to 5C. It may also be possible that, at a given time, not all but only some of the pins of the devices under test may receive different signal components. For example, a signal component at the pin 312 of the first device under test 301 may be the same as the signal component at one of the several pins 310, 311 of the second device under test 302. For example, at the time $t_1$, the first pin 310 of the second device under test 302 may receive the first signal component 305, which is also received at $t_1$ by the pin 312 of the first device under test 301. The second pin 311 of the second device under test 302 may, however, receive a signal component 306, 307 that is different from the signal component 305 which may be received at both the pin 312 of the first device under test 301 and the pin 310 of the second device under test 302.

Figure 6:
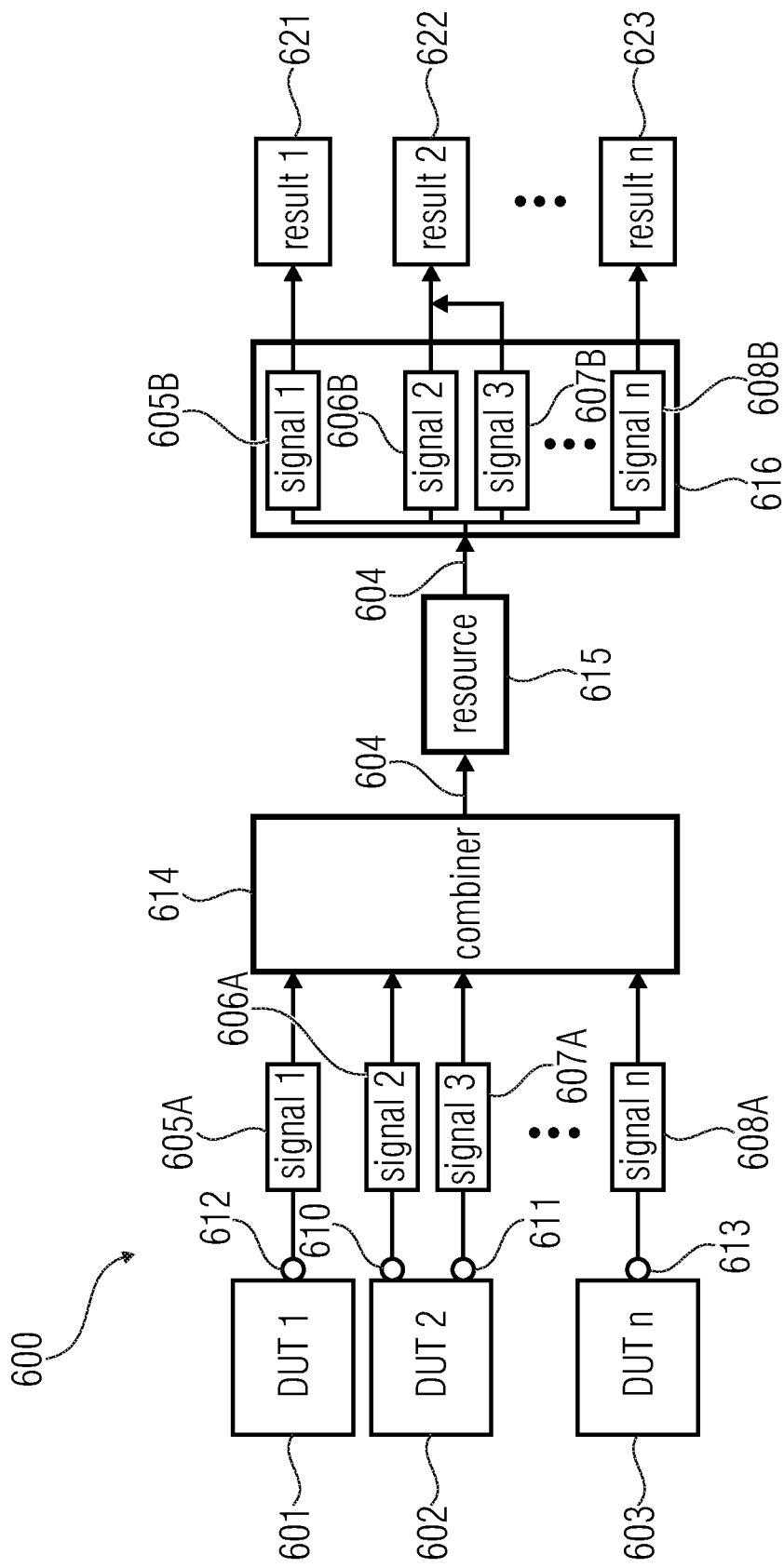
FIG. 6 shows a block diagram of an automated test equipment according to a further embodiment of the present invention.

FIG. 6 shows a further embodiment of an automated test equipment 600 for testing devices under test 601, 602, 603 according to the present invention.

The automated test equipment 600 is configured to combine different output signals 605A, 606A, 607A, 608A from multiple output pins 610, 611 of a single device under test 602 or from output pins 610, 611, 612, 613 of a plurality of devices under test 601, 602, 603 to obtain a combined signal 604.

The automated test equipment 600 is further configured to extract individual signals 605B, 606B, 607B, 608B or properties of the individual signals 605B, 606B, 607B, 608B from the combined signal 604.

For example, as shown in FIG. 6, the automated test equipment 600 may be configured to test a first device under test 601, a second device under test 602 and a $n^{th}$ device under test 603. The first device under test 601 and the $n^{th}$ device under test 603 may each comprise one output pin 612, 613. The second device under test 602 may comprise two output pins 610, 611.

The output pin 612 of the first device under test 601 is configured to output an output signal 605A, the first output pin 610 of the second device under test 602 is configured to output an output signal 606A, the second output pin 611 of the second device under test 602 is configured to output an output signal 607A, and the output pin 613 of the $n^{th}$ device under test 603 is configured to output an output signal 608A.

The automated test equipment 600 may comprise a combiner 614 for combining one or more of the respective output signals 605A, 606A, 607A, 608A into a combined signal 604. Thus, the combined signal 604 contains the information of the individual output signals 605A, 606A, 607A, 608A.

The output signals 605A, 606A, 607A, 608A may, for instance, be combined into the combined signal 604 by time-multiplexing, code-multiplexing or frequency-multiplexing, or the output signals 605A, 606A, 607A, 608A may be combined into the combined signal 604 if they are orthogonal in any other way.

The combined signal 604 may be routed to an automated tester equipment tester resource 615, which may be configured to measure the combined signal 604. Since the combined signal 604 comprises all of the output signals 605A, 606A, 607A, 608A, all of these signals are measured in parallel, i.e. at substantially the same time, with only one tester resource 615.

The automated test equipment 600 may comprise a signal extraction unit 616 that may be configured to extract the individual signals 605B, 606B, 607B, 608B or properties of the individual signals from the measured combined signal 604.

In an embodiment, the individual signals 605B, 606B, 607B, 608B or the properties of the individual signals 605B, 606B, 607B, 608B may be extracted from the measured combined signal 604 by appropriate signal analysis algorithms. The signal extracting unit 616 may comprise a digital filter or an analog filter to extract the individual signals 605B, 606B, 607B, 608B or the properties of the individual signals from the measured combined signal 604.

A respective result 621, 622, 623 may be obtained for each of the extracted individual signals 605B, 606B, 607B, 608B. In particular, a first result 621 may be obtained for the first extracted signal 605B, a second result 622 may be obtained for the second and the third extracted signal 606B, 607B, and an $n^{th}$ result 622 may be obtained for the $n^{th}$ extracted signal 608B.

As mentioned above, the output signals 605A, 606A, 607A, 608A may have been combined into the combined signal 604 by time-multiplexing, code-multiplexing or frequency-multiplexing, or the output signals 605A, 606A, 607A, 608A may have been combined into the combined signal 604 if they were orthogonal in any other way. In either case, this allows an alleviated separation of the individual signals 605B, 606B, 607B, 608B from each other by the signal extracting unit 616, i.e. when these signals are extracted from the measured combined signal 604. In other words, the automated test equipment 600 is adapted to separate the individual signals 605B, 606B, 607B, 608B from each other when these signals are extracted from the measured combined signal 604.

The individual signals 605B, 606B, 607B, 608B may comprise different frequencies or frequency components, or wherein the individual signals 605B, 606B, 607B, 608B have been code-multiplexed or time-multiplexed into the combined signal 604.

It is possible to combine distinctly different signals 605A, 606A, 607A, 608A (digital signals, analog signals, Radio-Frequency signals, time-varying signals, time-constant signals, etc.) into one common combined signal 604 as long as these individual signals meet the above-mentioned criteria and as long as the inventive automated test equipment tester resource 615 is able to cope with these individual signals.

According to an embodiment, the different individual output signals 605A, 606A, 607A, 608A may be at least two out of a digital signal, an analog signal, a Radio-Frequency signal and a direct current (DC) signal.

Still with reference to FIG. 6, the automated test equipment 600 may, for instance, be configured to process different output signals 605A, 606A, 607A, 608A comprising such different signal characteristics. For example, the first signal 605A that is outputted by output pin 612 of the first device under test 601 may be an analog signal. The second signal 606A that is outputted by output pin 610 of the second device under test 602 may be a digital signal. The third signal 607A that is outputted by output pin 611 of the second device under test 602 may be a Radio-Frequency signal. The fourth signal 608A that is outputted by output pin 613 of the third device under test 603 may be a direct current (DC) signal.

The automated test equipment 600 is configured to combine these different individual signals 605A, 606A, 607A, 608A into one single common combined signal 604. This combined signal 604 may then be routed to only one automated test equipment tester resource 615 which is configured to measure the combined signal 604 in only one single shot. This saves expensive automated test equipment resources and simultaneously reduces the measurement execution time.

Figure 7:
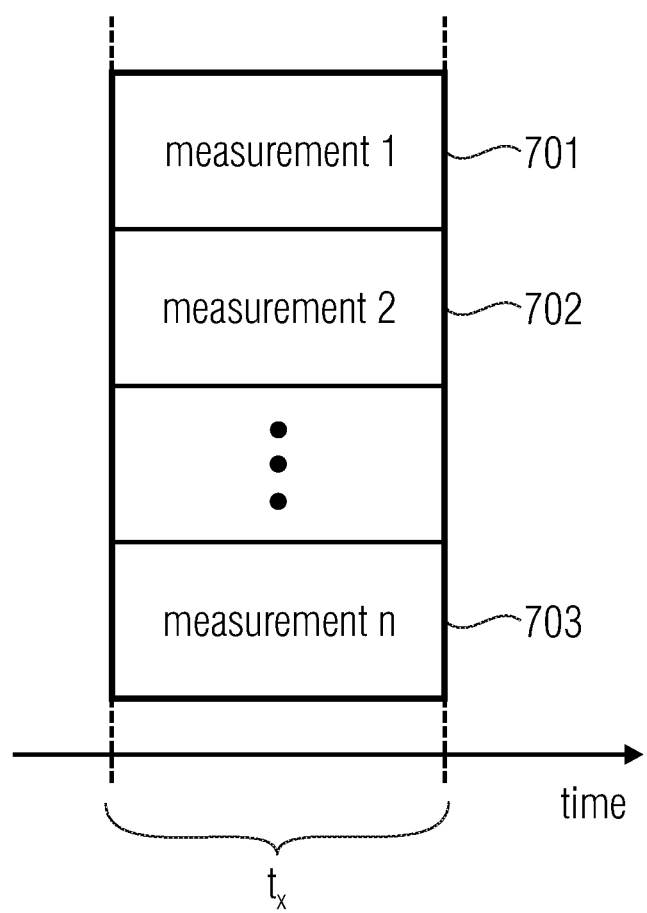
FIG. 7 shows a timing diagram of a measurement conducted with an embodiment of an automated test equipment according to the invention.

As can be seen in FIG. 7, each measurement 701, 702, 703 can be done simultaneously within the same time span $t_x$, since only the combined signal 604 is measured during $t_x$, wherein the combined signal 604 contains all of the separate individual signals that are outputted from the devices under test. Stated differently, there is no need to measure each of the individual output signals separately one after the other as they can be measured all together as they are contained in the combined signal 604.

Accordingly, the automated test equipment 600 may be configured to combine, for instance, a time-varying signal and a time-constant signal into a combined signal, and/or a digital signal and an analog signal into a combined signal.

Still with reference to FIG. 6, the automated test equipment 600 is not only configured to combine different individual signals into a combined signal 604, but also to extract these different individual signals from the combined signal 604. As each of the signals may comprise a different signal characteristic (e.g. analog, digital, RF, DC, etc.) the automated test equipment 600 is configured to separate these signals from each other when they are extracted from the measured combined signal 604.

Referring to the above described example, the first signal 605A may be an analog signal, the second signal 606A may be a digital signal, the third signal 607A may be a Radio-Frequency (RF) signal, and the fourth signal 608A may be a DC signal. These signals are combined into the combined signal 604 and measured by the tester resource 615.

The signals are extracted from the measured combined signal 604. The first signal 605B may be extracted from the combined signal 604, wherein the automated test equipment 600 is configured to determine that the first signal 605B is an analog signal. Thus, the automated test equipment 600, in particular the signal extracting unit 616, may be configured to separate this analog signal 605B from the other signal types (digital, RF, DC, etc.) upon extracting the signals from the combined signal 604. Similarly, the second signal 606B may be determined as a digital signal and may be separated from the other signals (analog, RF, DC, etc.) upon extraction from the combined signal 604. The third signal 607B may be determined as an RF-signal and may be separated from the other signals (analog, digital, DC, etc.) upon extraction from the combined signal 604. The fourth signal 608B may be determined as a DC signal and may be separated from the other signals (analog, digital, RF, etc.) upon extraction from the combined signal 604.

Accordingly, the automated test equipment 600 may be configured to combine and separate different types of signals, for instance, a time-varying signal and a time-constant signal, and/or a digital signal and an analog signal.

Stated differently, the automated test equipment 600 provides for a combination of different individual signals 605A, 606A, 607A, 608A into a combined signal 604, and a separation of different individual signals 605B, 606B, 607B, 608B from a combined signal 604. The individual output signals 605A, 606A, 607A, 608A that are outputted by the devices under test 601, 602, 603 and combined into the combined signal 604 may correspond to the separated individual signals 605B, 606B, 607B, 608B after the combined signal 604 has been measured.

Figure 8:
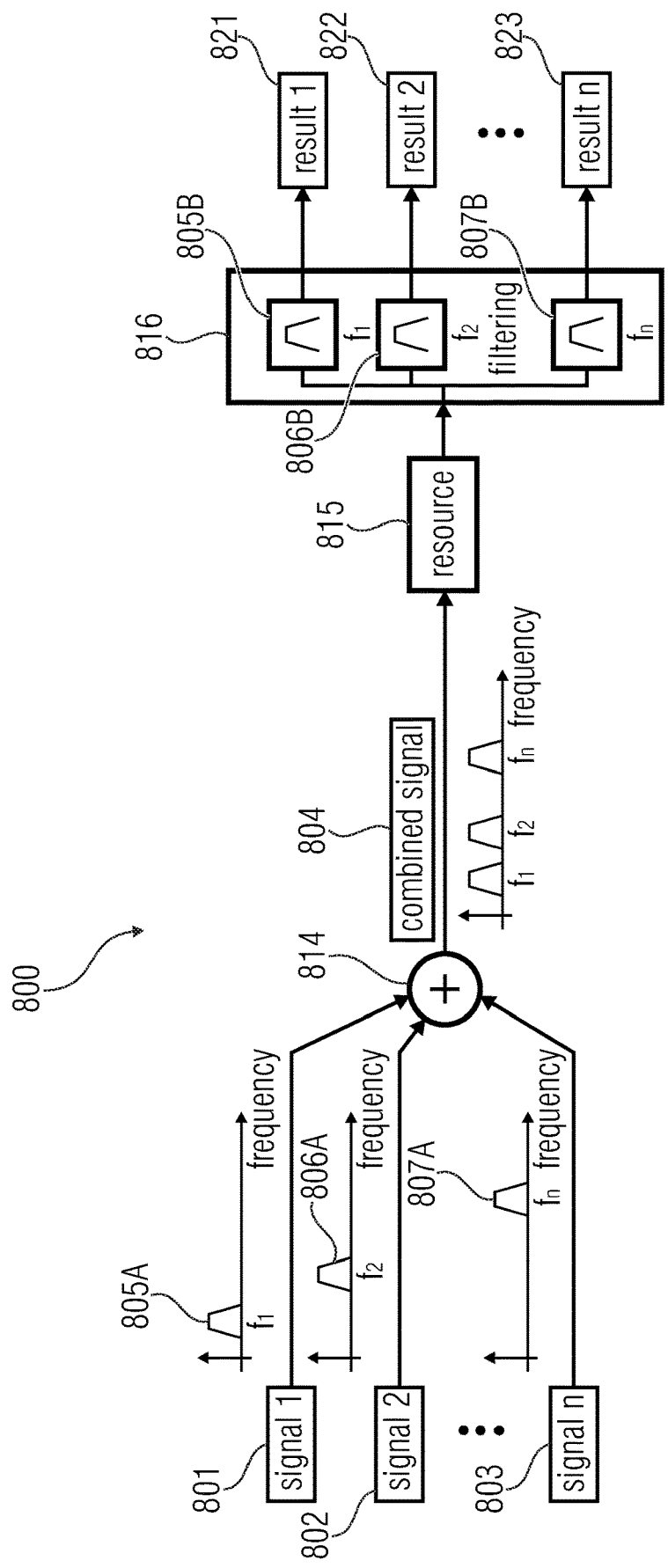
FIG. 8 shows a block diagram of an automated test equipment according to a further embodiment of the present invention.

FIG. 8 shows a further embodiment of an automated test equipment 800 according to the present invention. It shows an example where individual signals 801, 802, 803 at different frequency bands are combined by an additive operation. The resulting combined signal 804 contains all frequencies of the individual signals. It is measured by only one automated test equipment tester resource 815. The individual results 821, 822, 823 are derived by filtering out the respective frequency bands.

The first signal 801 may be an output signal from an output pin of a first device under test (not shown). The first signal 801 may comprise one or more signal components within a first frequency band $f_1$ denoted with reference numeral 805A.

The second signal 802 may be an output signal from a further output pin of the first device under test, or from a different output pin of a second device under test (not shown). The second signal 802 may comprise one or more signal components within a second frequency band $f_2$ denoted with reference numeral 806A, wherein the second frequency band 806A of the second signal 802 is different to the first frequency band 805A of the first signal 801.

The third signal 803 may be an output signal from an output pin of a third device under test (not shown). The third signal 803 may comprise one or more signal components within a third frequency band $f_3$ denoted with reference numeral 807A. The third frequency band 807A of the third signal 803 is different to the second frequency band 806A of the second signal 802 and different to the first frequency band 805A of the first signal 801.

The automated test equipment 800 may comprise a combiner 814 which combines the individual signals 801, 802, 803 into a combined signal 804. The combined signal 804 thus comprises the information, i.e. the one or more signal components contained within the respective frequency bands 805A, 806A, 807A, of the respective signals 801, 802, 803.

The combined signal 804 is measured by the automated test equipment resource 815, wherein a respective individual result may be obtained for each of the signals 801, 802, 803. For that, the automated test equipment 800 is configured to separate the individual signals 801, 802, 803 from each other and to extract the individual signals 801, 802, 803 or the properties of the individual signals from the combined signal 604, similar as described above with reference to FIG. 6.

As can be seen in FIG. 8, the respective different frequency bands 805B, 806B, 807B can be extracted from the measured combined signal 804 and a respective individual result 821, 822, 823 can be obtained for each of the frequency bands 805B, 806B, 807B.

As all of the individual signals 801, 802, 803 are combined into one common combined signal 804, it may be sufficient to provide only one automated test equipment tester resource 815 to measure this combined signal 804 and, thus, all of the individual signals 801, 802, 803 contained therein. The respective individual results 821, 822, 823 for each of the individual signals 801, 802, 803 can be obtained as the automated test equipment 800 is configured to extract the individual signals from the combined signal 804.

Figure 9:
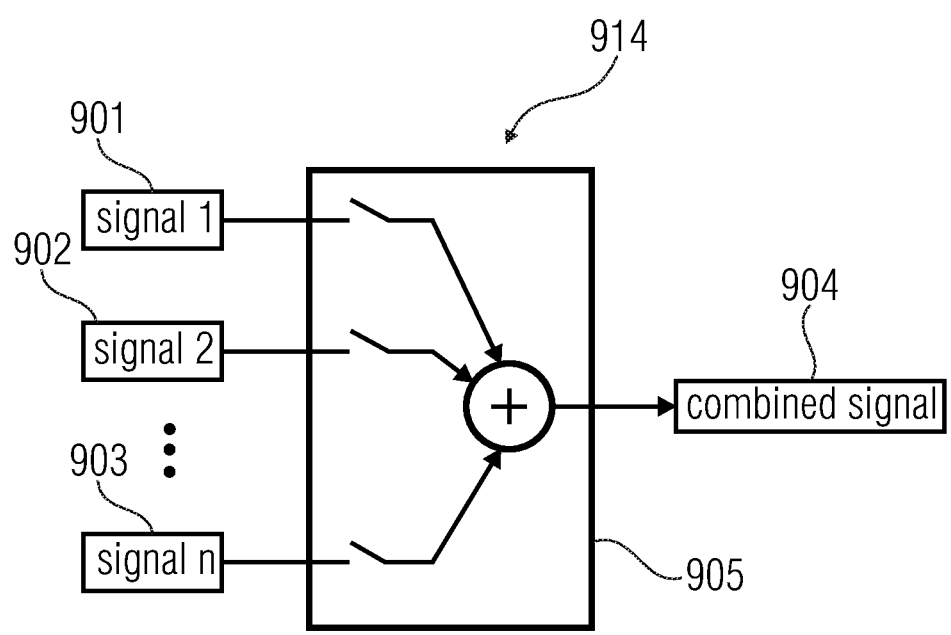
FIG. 9 shows a switchable signal routing circuit that can be used for providing a combiner of the automated test equipment according to the invention.

An example of a combiner 614, 814, 914 for combining the plurality of different single signals into a common combined signal is shown in FIG. 9. A switchable signal routing circuit 905, as for example disclosed in PCT/EP2013/054303, may be used to implement an additive combiner 614, 814, 914. Using this circuit 905, it is possible to select the signals 901, 902, 903 to be combined into a combined signal 904 at runtime. All signals 901, 902, 903 that are connected to the switchable signal routing circuit 905 can be combined (added) in any possible configuration. It is possible to route only one signal to the automated test equipment resource 615, 815 as well as all signals combined as well as any other combination. This greatly increases the flexibility of test program development.

Figure 10:
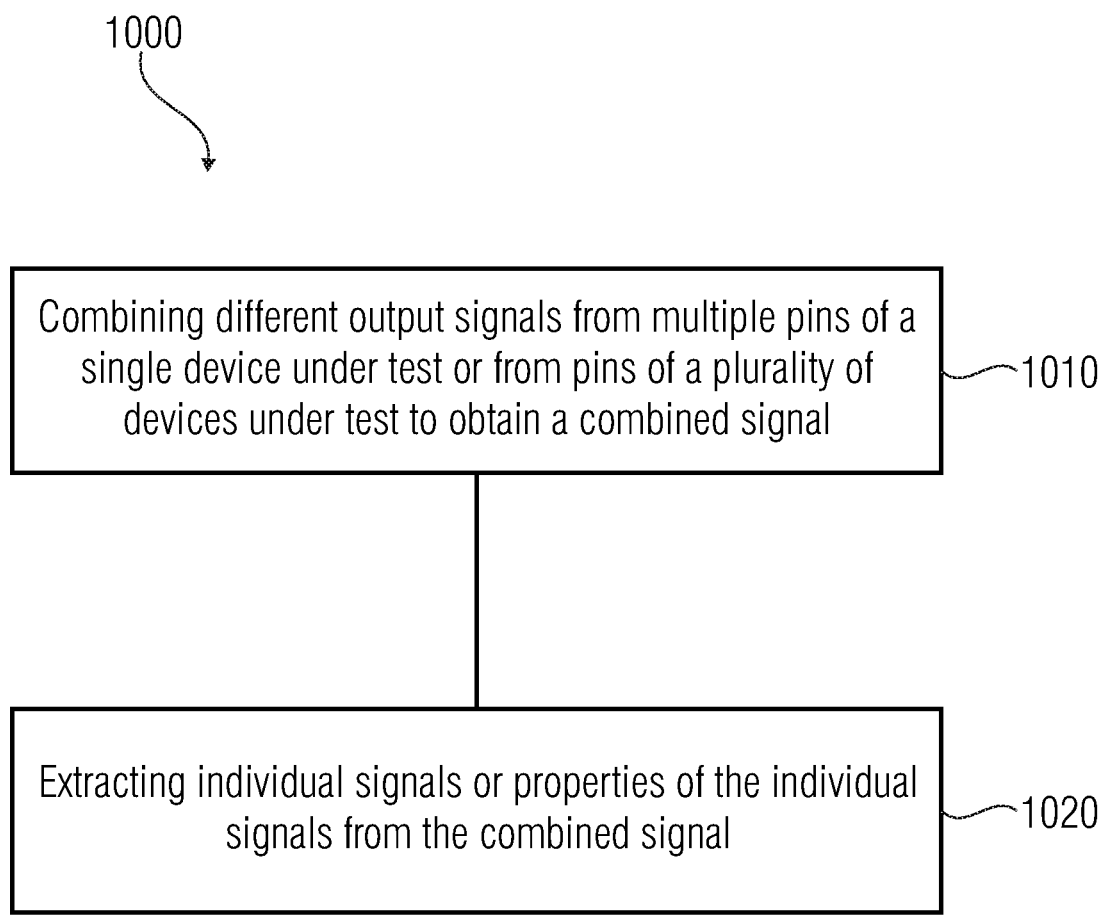
FIG. 10 shows a block diagram of a method for testing devices under test according to the present invention.

FIG. 10 shows an embodiment of a method for testing devices under test according to the present invention.

At block 1010, the method comprises combining different output signals from multiple pins of a single device under test or from pins of a plurality of devices under test to obtain a combined signal.

At block 1020, the method comprises extracting individual signals or properties of the individual signals from the combined signal.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An apparatus comprising:
   an automated test equipment for testing devices, wherein the automated test equipment is configured
      to generate a combined signal comprising a plurality of different signal components, wherein the plurality of different signal components are multiplexed into combined signals, and
      to provide the combined signal to a plurality of pins of a plurality of devices under test, wherein at least one of the plurality of different signal components comprises a different signal characteristic relative to another one of the plurality of different signal components, and wherein at a predetermined time respective ones of the plurality of different signal components are received and evaluated by respective ones of the plurality of devices under test.

2. The apparatus according to claim 1, wherein the automated test equipment is further configured to control the devices to cause, at a given time, different ones of the devices to evaluate a same one of the different signal components of the combined signal.

3. The apparatus according to claim 1, wherein the automated test equipment is further configured to control the devices to cause, at a given time, different ones of the devices to evaluate different ones of the different signal components of the combined signal.

4. An apparatus comprising:
an automated test equipment for testing devices, wherein the automated test equipment is configured:
to combine a first plurality of different output signals from at least one of multiple pins of a device under test or a plurality of pins of a plurality of devices under test to acquire a combined signal, wherein the first plurality of different output signals are multiplexed into the combined signal;
to extract at least one of a plurality of individual signals or at least one of a plurality of properties from the combined signal, wherein the plurality of individual signals corresponds to the first plurality of different output signals;
generate a combined signal comprising a second plurality of different signal components, wherein the second plurality of different signal components are multiplexed into the combined signals; and
to provide the combined signal to at least one of multiple pins of a device under test or a plurality of pins of a plurality of devices under test.

5. The apparatus according to claim 4, wherein the different output signals comprise at least two out of a digital signal, an analog signal, a Radio-Frequency signal, or a DC signal.

6. The apparatus according to claim 4, wherein the different output signals are at least one of time-multiplexed into the combined signal, frequency-multiplexed into the combined signal, or code-multiplexed into the combined signal.

7. The apparatus according to claim 4, wherein the automated test equipment is further configured to separate out the different output signals which are time-multiplexed into the combined signal, frequency-multiplexed into the combined signal, or code-multiplexed into the combined signal.

8. The apparatus according to claim 4, wherein the automated test equipment comprises a signal extracting unit that is configured to perform the extraction of the at least one of the individual signals or the properties of the individual signals from the combined signal, and wherein the signal extracting unit comprises a digital filter.

9. The apparatus according to claim 4, wherein the automated test equipment comprises a signal extracting unit that is configured to extract at least one of the individual signals or the properties of the individual signals from the combined signal, and wherein the signal extracting unit comprises an analog filter.

10. The apparatus according to claim 4, wherein the automated test equipment is further configured to separate the individual signals from the combined signal, and wherein the individual signals comprise at least two out of a digital signal, an analogue signal, a Radio-Frequency signal, or a DC signal.

11. The apparatus according to claim 4, wherein the automated test equipment is further configured to separate the individual signals from the combined signal, and wherein the individual signals comprise at least one of different frequencies or different frequency components.

12. The apparatus according to claim 4, further comprising a single tester resource configured to measure the combined signal.

13. The apparatus according to claim 12, wherein the at least a portion of the measurement of the more than one of the plurality of properties from the combined signal are perform simultaneously.

14. A method for testing devices, the method comprising:
generating in automated test equipment a first combined signal comprising a first plurality of different signal components, wherein the first plurality of different signal components are multiplexed into the first combined signal;
providing the first combined signal to at least one of multiple pins of a device under test or a plurality of devices under test;
combining in the automated test equipment a second plurality of different output signals from multiple pins of a device under test or respective pins of a plurality of devices under test to acquire a second combined signal, wherein the second plurality of different signal components are multiplexed into the second combined signal; and
extracting at least one of a plurality of individual signals or properties of the individual signals from a combined signal, wherein the plurality of individual signals or properties correspond to the second plurality of different output signals.

15. The method according to claim 14, wherein the different output signals comprise at least two out of a digital signal, an analog signal, a Radio-Frequency signal, or a DC signal.

16. The method according to claim 14, wherein the different output signals are at least one out of time-multiplexed into the combined signal, frequency-multiplexed into the combined signal, or code-multiplexed into the combined signal.

17. The method according to claim 14, further comprising measuring the combined signal in a single tester resource.

18. The method according to claim 14, wherein the extracting includes filtering operations.

19. A non-transitory digital storage medium having a computer program stored thereon when implemented by a processor to directs a method for testing devices, the method comprising:
combining a plurality of different individual signals from a plurality of pins of a plurality of devices under test to acquire a combined signal, wherein at least one of the plurality of individual signals comprises a different signal property relative to another one of the plurality of individual signals; and
extracting respective ones of the plurality of individual signals or properties of the individual signals from the combined signal, wherein the respective ones of the plurality of individual signals or properties of the individual signals are extracted at a predetermined time.

* * * * *